United States Patent [19]

Papathomas et al.

[11] Patent Number: 5,471,096
[45] Date of Patent: Nov. 28, 1995

[54] SOLDER INTERCONNECTION FROM A COMPOSITION CONTAINING A MIXTURE OF DICYANATES

[75] Inventors: Kostas I. Papathomas; Frederick R. Christie, both of Endicott; David W. Wang, Vestal, all of N.Y.

[73] Assignee: International Business Machines Corporation, Armonk, N.Y.

[21] Appl. No.: 145,678

[22] Filed: Nov. 4, 1993

Related U.S. Application Data

[62] Division of Ser. No. 745,760, Aug. 16, 1991, abandoned.

[51] Int. Cl.$^6$ .................................................. H01L 23/29
[52] U.S. Cl. .................... 257/778; 252/183.11; 257/788; 257/789
[58] Field of Search ................... 252/182.23, 183.11; 257/779, 787, 789, 793, 794, 783, 788, 777, 778, 795; 528/422; 524/606, 612, 847

[56] References Cited

U.S. PATENT DOCUMENTS

| | | | |
|---|---|---|---|
| 4,701,479 | 10/1987 | Shiobara et al. | 523/220 |
| 4,709,008 | 11/1987 | Shimp | 528/422 |
| 4,740,584 | 4/1988 | Shimp | 528/422 |
| 4,795,769 | 1/1989 | Henkel et al. | 523/219 |
| 4,812,490 | 3/1989 | Kleeberg et al. | 523/443 |
| 4,839,442 | 6/1989 | Craig, Jr. | 528/422 |
| 4,893,171 | 1/1990 | Denda | 357/72 |
| 4,931,852 | 6/1990 | Brown et al. | 357/72 |
| 4,946,928 | 8/1990 | Jackson et al. | 528/205 |
| 4,999,699 | 3/1991 | Christie et al. | 357/65 |
| 5,030,433 | 7/1991 | Mehrotra | 423/335 |
| 5,068,309 | 11/1991 | Shimp et al. | 528/211 |
| 5,089,440 | 2/1992 | Christie et al. | 437/209 |
| 5,121,190 | 6/1992 | Hsiao et al. | 357/80 |

*Primary Examiner*—William Mintel
*Assistant Examiner*—Peter Toby Brown
*Attorney, Agent, or Firm*—Pollock, Vande Sande & Priddy

[57] ABSTRACT

Compositions containing bisphenol M dicyanate, prepolymer thereof, or mixtures thereof, and 4,4'-ethylidene bisphenol dicyanate, prepolymer thereof or mixtures thereof; and filler having maximum particle size of 20 microns and being substantially free of alpha particle emissions. The compositions are useful in forming interconnection structures for forming an integrated semiconductor device to a carrier substrate.

17 Claims, 1 Drawing Sheet

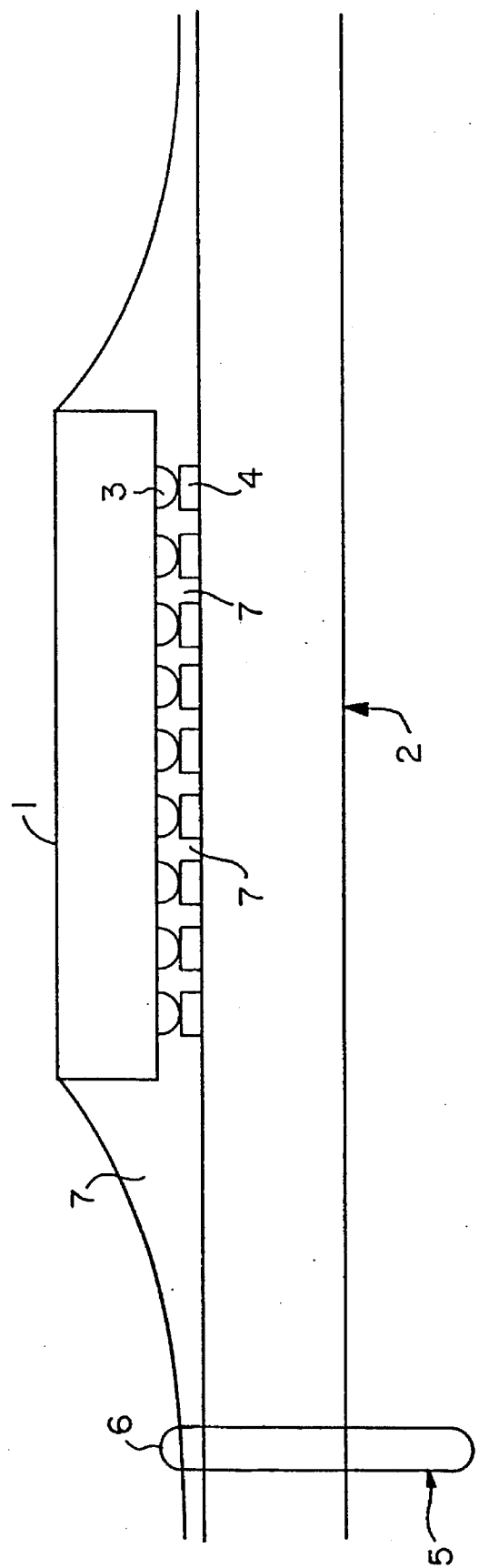

SOLDER INTERCONNECTION FROM A COMPOSITION CONTAINING A MIXTURE OF DICYANATES

This application is a division of Ser. No. 07/745,760 filed on Aug. 16, 1991, now abandoned.

DESCRIPTION

1. Technical Field

The present invention is concerned with compositions that are useful in interconnection structures for joining an integrated semiconductor device to a carrier substrate of organic or ceramic nature and particularly to compositions that exhibit improved high temperature stability. The present invention is especially concerned with so-called "controlled collapse chip connection" or "C4" that employs solder-bump interconnections. Such is also referred to as the face down or flip-chip bonding. The present invention is also concerned with a method of making the interconnection structure.

2. Background Art

Controlled collapse chip connection (C4) or flip-chip technology has been successfully used for over twenty years for interconnecting high I/O (input/output) count and area array solder bumps on the silicon chips to the base ceramic chip carriers, for example alumina carriers. The solder bump, typically a 95 Pb/5 Sn alloy, provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a carrier. Typically, a malleable pad of metallic solder is formed on the semiconductor device contact site and solder joinable sites are formed on the conductors on the chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the carrier. With the development of the integrated circuit semiconductor device technology, the size of individual active and passive elements have become very small, and the number of elements in the device has increased dramatically. This results in significantly larger device sizes with larger numbers of I/O terminals. This trend will continue and will place increasingly higher demands on device forming technology. An advantage of solder joining a device to a substrate is that the I/O terminals can be distributed over substantially the entire top surface of the semiconductor device. This allows an efficient use of the entire surface, which is more commonly known as area bonding.

Usually the integrated circuit semiconductor devices are mounted on supporting substrates made of materials with coefficients of expansion that differ from the coefficient of expansion of the material of the semiconductor device, i.e. silicon. Normally the device is formed of monocrystalline silicon with a coefficient of expansion of $2.6 \times 10^{-6}$ per °C. and the substrate is formed of a ceramic material, typically alumina with a coefficient of expansion of $6.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of expansion. This imposes stresses on the relatively rigid solder terminals.

The stress on the solder bonds during operation is directly proportional to (1) the magnitude of the temperature fluctuations, (2) the distance of an individual bond from the neutral or central point (DNP), and (3) the difference in the coefficients of expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

The disclosure of an improved solder interconnection structure with increased fatigue life can be found in U.S. Pat. No. 4,604,644 to Beckham, et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the support substrate, dielectric organic material disposed between the peripheral area of the device and the facing area of the substrate, which material surrounds at least one outer row and column of solder connections but leaves the solder connections in the central area of the device free of dielectric organic material.

The preferred material disclosed in U.S. Pat. No. 4,604,644 is obtained from a polyimide resin available commercially and sold under the trademark AI-10 by Amoco Corporation. AI-10 is formed by reacting a diamine such as p,p'diaminodiphenylmethane with a trimellitic anhydride or acylchloride of trimellitic anhydride. The polymer is further reacted with γ-amino propyl triethoxy silane (A1100) or β-(3,4-epoxy cyclohexyl) ethyltrimethoxy silane (A186) from Dow Corning. The coating material is described in *IBM Technical Disclosure Bulletin*, September 1970, p. 825.

The dielectric material is typically applied by first mixing it with a suitable solvent and then dispensing it along the periphery of the device where it can be drawn in between the device and substrate by capillary action.

Encapsulants that exhibit, among other things, improved fatigue life of C4 solder connections are disclosed in U.S. Pat. No. 4,999,699 to Christie et al. and assigned to the assignee of the present invention, disclosure of which is incorporated herein by reference. In particular, U.S. Pat. No. 4,999,699 discloses a curable composition containing a binder which is a cycloaliphatic polyepoxide and/or a cyanate ester or prepolymer thereof and a filler. The cycloaliphatic polyepoxide, cyanate ester and cyanate ester prepolymer employed have viscosities at normal room temperatures (25° C.) of no greater than about 1,000 centipoise. The filler has a maximum particle size of 31 microns and is substantially free of alpha particle emissions. The amount of binder (i.e.—epoxy and/or cyanate ester) is about 60 to about 25 percent by weight of the total of the binder and filler and, correspondingly, the filler is about 40 to about 75 percent by weight of the total of the binder and filler.

In addition, U.S. patent application Ser. No. 07/493,125 to McCreary et al., now U.S. Pat. No. 5,121,190 and assigned to the assignee of the present application, disclosure of which is incorporated herein by reference, discloses providing C4 solder connections of an integrated semiconductor device on an organic substrate. The compositions disclosed therein are curable compositions containing a thermosetting binder and filler. The binder employed has viscosity at normal room temperatures (25° C.) of no greater than about 1,000 centipoise. Suitable binders disclosed therein include polyepoxides, cyanate esters and prepolymers thereof.

The technique disclosed therein enables chips to be attached directly on the surface of a board thereby eliminating an intermediate chip carrier.

Although, the above techniques disclosed in U.S. Pat. No. 4,999,699 and U.S. patent application Ser. No. 07/493,125, now U.S. Pat. No. 5,121,190 have been quite successful, there still remains room for improvement, especially in the resistance to high temperatures.

SUMMARY OF THE INVENTION

The present invention is concerned with compositions that exhibit excellent thermal stability along with relatively low coefficients of thermal expansion. The compositions of the present invention are especially useful in achieving fatigue life enhancement of the C4 solder connections of an integrated semiconductor device on a substrate.

The present invention provides a composition that exhibits excellent wetting and coverage of the C4 connections as well as the pin heads under the device that are present. In fact, the present invention makes it possible to achieve complete coverage beneath the chip. The compositions of the present invention exhibit even and adequate flow under the semiconductor device.

The compositions of the present invention include a binder component and a filler. The binder component contains about 40 to about 70% by weight of 4,4'-[1,3-phenylenebis (1-mehylethylidene)]-2,2',6,6' -R-bisphenyl cyanate (i.e.-bisphenol $M^+$ dicyanate) and/or a prepolymer thereof, and corresponding, about 60 to about 30% by weight of 4,4'-ethylidene bisphenol dicyanate and/or prepolymer thereof. The filler employed has a maximum particle size of about 20 microns and is substantially free of alpha particle emissions. The amount of the binder component is about 30 to about 50% by weight of the total of the binder component and filler. The amount of the filler is correspondingly about 50% to about 70% by weight based upon the amount of the binder component and filler.

The present invention is also concerned with solder interconnection for forming connections between an integrated semiconductor device and a carrier substrate. The solder interconnection includes a plurality of solder connections that extend from the carrier substrate to electrodes on the semiconductor device to form a gap between the carrier substrate and the semiconductor device. The gap is filled with a composition obtained from curing the above disclosed composition.

Furthermore, the present invention is concerned with a method of increasing the fatigue life of solder interconnections between a semiconductor device and a supporting substrate. The method includes attaching the device to the substrate by a plurality of solder connections that extend from the supporting substrate to electrodes on the semiconductor device to form a gap between the supporting substrate and the semiconductor device. The gap is filled with the above disclosed binder-filler composition and the composition is cured.

SUMMARY OF DRAWINGS

FIG. 1 is a schematic diagram of a solder interconnection Pursuant to the present invention.

BEST AND VARIOUS MODES FOR CARRYING OUT INVENTION

To facilitate understanding of the present invention, reference is made to FIG. 1. In FIG. 1, numeral 1 represents a semiconductor chip joined to the chip carrier 2 by solder bumps 3 mated to pads 4. I/O pins 5 extend and protrude from the carrier 2, with a small portion 6 of the pins protruding from the other side of the carrier for carrying current thereto. When the carrier is an organic substrate, the pins (6) as such are not required. Instead, electrically conductive circuitry and interconnections would be provided such as at the periphery of substrate for connection to a desired structure. The encapsulant 7 pursuant to the present invention provides for essentially void free encapsulation of the solder connections thereby assuring highly reliable devices and fills the gap forming a uniform fillet around the chip as well as covering the pin heads under the device (not shown).

The binder component of the compositions of the present invention includes bisphenol M dicyanate and/or prepolymers thereof; and 4,4'-ethylidene bisphenol dicyanate and/or prepolymer thereof.

The 4,4'-ethylidene bisphenol dicyanate (bisphenol AD dicyanate) is available from Hi-Tek Polymers under the trade designation AROCY L-10.

The 4,4'-[1,3-phenylenebis (1-methylethylidene)]-2,2',6, 6,'-R-bisphenyl cyanate (bisphenol M dicyanate) is available from Hi-Tek Polymers under the trade designation RTX-366. Bisphenol M dicyanate can be represented by the following formula:

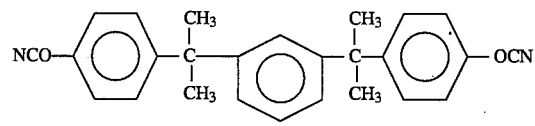

The prepolymers of the bisphenol M dicyanate most suitable for use in the present invention have conversions of up to about 30%. If prepolymers of bisphenol AD dicyanate are used, such should be liquid so as to facilitate dissolution of the other components of the composition. Preferably, such prepolymers of bisphenol AD dicyanate have a conversion of up to 15%.

The binder component contains about 40 to about 70% by weight and preferably about 70% by weight of the bisphenol M dicyanate and/or prepolymer thereof; and correspondingly about 60 to about 30% by weight and preferably about 30% by weight of the 4,4'-ethylidene bisphenol dicyanate and/or prepolymer thereof.

The compositions of the present invention also include a filler and especially an inorganic filler. The particle size of the filler must not be greater than about 20 microns or less, preferably about 0.7 to about 20 microns. This is necessary so that the compositions will have the desired CTE and viscosity characteristics and readily flow in the gap between the chip and substrate carrier. The gap is normally about 25 to about 160 microns and preferably about 75 to about 125 microns. The preferred fillers have average particle size of about 3 to about 5 microns.

In addition, the filler must be at least substantially free of alpha particle emissions such as from the trace amounts of radioactive impurities such as uranium and thorium normally present in conventional silica or quartz fillers. The fillers employed have emission rates of less than 0.01 alpha particles/cm$^2$-hr and preferably less 0.005 alpha particles/cm$^2$-hr. The presence of α-particle emissions primarily caused by the presence of uranium and thorium isotopes in the fillers can generate electron/hole pairs which in turn would be detrimental to the device. The preferred filler is high purity fused or amorphous silica. A commercially available filler that can be employed is DP4910 from PQ Corporation. The preferred filler can be optionally treated with a coupling agent.

The compositions of the present invention contain about 30 to about 50% by weight and preferably about 40% by weight of the binder and correspondingly about 70% to about 50% by weight and preferably about 60% by weight of the filler. These amounts are based upon the total amounts of binder and filler in the composition.

In addition to the binder and filler, the compositions can also include a catalyst to promote the polymerization of the cyanate ester mixture. Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, iron, zinc, and copper acetylacetonate or octoates or naphthenates. The amount of catalyst when used can vary, and generally will be 0.005 to 5 weight percent, preferably 0.05 to 0.5 weight percent based on total solid binder weight.

Surfactants in amounts of about 0.5% to about 3% and preferably about 1% to about 1.4% can be used to facilitate flow of the compositions. Suitable surfactants include silanes and non-ionic type surface active agents.

Especially preferred are the non-ionic alkylphenyl polyether alcohols including those available under the trade designation Triton from Rohm & Haas Co. These surface active agents are prepared by the reaction of octylphenol or nonylphenol with ethylene oxide and have the following general structural formula, respectively:

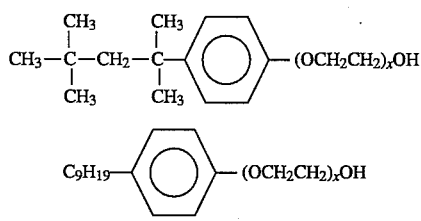

in which the C$_9$ alkyl group is a mixture of branched-chain isomers and x is the average number of ethylene oxide units in the ether side chain. Products of the above series of compounds include:

| | Octylphenol Series | |
|---|---|---|
| Triton | x-15 | x = 1 |
| Triton | x-35 | x = 3 |
| Triton | x-45 | x = 5 |
| Triton | x-114 | x = 7-8 |
| Triton | x-100 | x = 9-10 |
| Triton | x-102 | x = 12-13 |
| Triton | x-165 | x = 16 |
| Triton | x-305 | x = 30 |
| Triton | x-405 | x = 40 |
| Triton | x-705-50% | x = 70 |

| | -continued | |
|---|---|---|
| Triton | x-705-100% Nonylphenol Series | x = 70 |
| Triton | n-17 | x = 1.5 |
| Triton | n-42 | x = 4 |
| Triton | n-57 | x = 5 |
| Triton | n-60 | x = 6 |
| Triton | n-87 | x = 8.5 |
| Triton | n-101 | x = 9-10 |
| Triton | n-111 | x = 11 |
| Triton | n-150 | x = 15 |
| Triton | n-101 | x = 40 |

The preferred compositions of the present invention also include an organic dye in amounts less than about 0.2% to provide contrast. Suitable dyes are nigrosine and Orasol blue GN.

The preferred compositions of the present invention are substantially free (e.g.—less than 0.2% by weight) if not completely free from non-reactive organic solvents. Compositions employed pursuant to the present invention have viscosity at 25° C. (Brookfield cone & plate Spindle 51, 20 RPM or equivalent) of about 2,000 to about 20,000 centipoise and preferably about 2,000 to about 15,000 centipoise. The compositions are stable for at least 12 hours at room temperature. The compositions can be cured at temperatures of about 180° C. to about 220° C. in about 1 to about 2 hours and preferably about 1.5 hours. The compositions when cured have alpha particle emissions of less than about 0.005 preferably less than about 0.004 counts/cm$^2$-hr and most preferably less than about 0.002 counts/cm$^2$-hr. The cured compositions also have coefficient of thermal expansion of about 30 ppm/°C. to about 40 ppm/°C., glass transition temperature of greater than about 180° C. and preferably about 190° C. to about 230° C. The cured compositions have Shore D hardness of greater than 85 and preferably greater than 90, modulus of elasticity at 25° C. of greater than 1 Mpsi and preferably greater than 1.2 Mpsi.

The compositions of the present invention exhibit degradation temperatures of about 400° C. which demonstrates the excellent thermal stability of the compositions, a major advantage of the present invention.

The compositions are prepared by rapidly admixing the components under vacuum usually about 5 mm Hg either using a double planetary mixer or high shear mixer under vacuum to provide better and homogenous compositions.

The composition is applied by dispensing through nozzles under pressure of about 15 to about 90 psi and temperatures of about 25° C. to about 75° C. The compositions completely cover the C4 connections and pin heads. If desired, the compositions can be pregelled by heating for about 15 to about 60 minutes, typically about 30 minute at about 100° C. to about 120° C.

It is preferred that the substrates be at a temperature of about 80° C. to about 100° C. during the dispensing.

The compositions are then cured by heating to about 180° C. to about 200° C. for about 1 hours to about 3 hours and preferably about 1.5 hours to about 2.0 hours. The substrate employed can be an organic, inorganic or composite in nature. The preferred substrate can be a ceramic module or a multilayer printed circuit board. The preferred ceramic substrates include silicon oxides and silicates such as aluminum silicate, and aluminum oxides.

The preferred printed circuit board includes conventional FR-4 Epoxy and laminates based on high temperature resins such as high temperature epoxies, polyimides, cyanates (triazines), fluoropolymers, benzocyclobutenes, polyphenylenesulfide, polysulfones, polyetherimides, polyetherketones, polyphenyquinoxalines, polybenzoxazoles, and polyphenyl benzobisthiazoles.

The following non-limiting examples are presented to further illustrate the present invention.

EXAMPLE 1

A composition containing about 28 parts by weight of bisphenol M dicyanate (RTX-336 from Hi-Tek Polymers), about 12 parts by weight of 4,4'-ethylidene bisphenol dicyanate, (Arocy L10), about 60 parts by weight of fused silica available under the trade designation DP4910 from PQ Corporation, and having a particle size of 20 micrometers maximum and being free of alpha particle emissions; about 50 ppm of zinc octanoate; about 1.2 parts by weight of Triton X-100 (a surfactant) from Rohm & Haas and about 0.08 parts by weight of nigrosine is prepared.

The composition is dispensed at a temperature of about 30° C. in the gap of about 5 mils between a silicon chip soldered by solder bumps to 28×28 mm $Al_2O_3$ substrate having pins protruding therefrom. The composition is cured at about 180° C. in about 2 hours giving a product with a Tg of about 190° C. The cured composition has a coefficient of thermal expansion of less than $35 \times 10^{-6}$/°C. The composition covers the pin heads and solder bumps.

The structures tested for fatigue life exhibit no failures when thermocycling the parts for over 5,000 cycles between 0° C. to 100° C.

What is claimed is:

1. A solder interconnection for forming connections between an integrated semiconductor device and a carrier substrate comprising
   a plurality of solder connections that extend from the carrier substrate to electrodes on said semiconductor device to form a gap between said carrier substrate and the semiconductor device, wherein said gap is filled with a composition obtained from curing a composition containing:
   A. binder component containing
      1) about 40% to about 70% by weight of bisphenol M dicyanate, prepolymer thereof, or mixtures thereof; and
      2) correspondingly about 60% to about 30% by weight of 4,4'-ethylidene bisphenol dicyanate, prepolymer thereof, or mixtures thereof; and
   B. Filler having a maximum particle size of 20 microns and being substantially free of alpha particle emissions; wherein the amount of A is about 30% to about 50% by weight of the total of A and B and correspondingly, the amount of B is about 70% to about 50% by weight based upon the amount of A and B.

2. The solder interconnection of claim 1 wherein said binder component contains about 70% by weight of bisphenol M dicyanate and about 30% by weight of 4,4'-ethylidene bisphenol dicyanate.

3. The solder interconnection of claim 1 wherein said composition further contains about 0.5% to about 3% by weight of a surfactant.

4. The solder interconnection of claim 1 wherein said composition further includes about 1% to about 1.4% by weight of a surfactant.

5. The solder interconnection of claim 1 wherein the amount of filler is about 60% by weight.

6. The solder interconnection of claim 1 wherein the viscosity of said composition at 25° C. is about 2,000 to about 15,000 centipoise.

7. The solder interconnection of claim 1 wherein said filler is an inorganic filler selected from the group of silica, quartz and fused silica coated with coupling agents.

8. The solder interconnection of claim 1 wherein said filler has emission rate of less than 0.005 alpha particles/$cm^2$-hr.

9. The solder interconnection of claim 1 wherein said filler has particle sizes of about 0.5 to about 20 micrometers.

10. The solder interconnection of claim 1 wherein said gap is about 2 to about 6.0 mils wide.

11. The solder interconnection of claim 1 wherein said composition is substantially free of unreactive organic solvents.

12. The solder interconnection of claim 1 wherein said composition further includes a catalyst.

13. The solder interconnection of claim 3 wherein said surfactant is selected from the group consisting of silanes and non-ionic surface active agents.

14. The solder interconnection of claim 3 wherein said surfactant is a non-ionic alkylphenyl polyether alcohol.

15. The solder interconnection of claim 1 wherein said prepolymer bisphenol M dicyanate has a conversion of up to 30% and said prepolymer of 4,4'-ethylidene bisphenol dicyanate has a conversion of up to 15%.

16. The solder interconnection of claim 6 wherein said composition in its cured state exhibits coefficient of thermal expansion of about 30 ppm/°C. to about 40 ppm/°C., glass transition temperature of greater than 180° C., Shore D hardness of greater than 85, and modulus of elasticity of 25° C. of greater than 1 Mpsi.

17. The solder interconnection of claim 16 wherein said glass transition temperature is about 190° C. to about 230° C., said Shore D hardness is greater than 90, and said modulus of elasticity at 25° C. is greater than 1.2 Mpsi.

* * * * *